(12) United States Patent
Zhang et al.

(10) Patent No.: US 11,463,101 B2
(45) Date of Patent: Oct. 4, 2022

(54) TECHNIQUES FOR HIGH-SPEED EXCESS LOOP DELAY COMPENSATION IN SIGMA-DELTA ANALOG-TO-DIGITAL CONVERTERS

(71) Applicant: NXP B.V., Eindhoven (NL)

(72) Inventors: Chenming Zhang, Eindhoven (NL); Lucien Johannes Breems, Waalre (NL); Muhammed Bolatkale, Delft (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/158,913

(22) Filed: Jan. 26, 2021

(65) Prior Publication Data

US 2022/0239314 A1    Jul. 28, 2022

(51) Int. Cl.
H03M 3/00    (2006.01)

(52) U.S. Cl.
CPC ............. *H03M 3/464* (2013.01); *H03M 3/37* (2013.01); *H03M 3/424* (2013.01)

(58) Field of Classification Search
CPC ......... H03M 3/37; H03M 3/424; H03M 3/464
USPC .......................................... 341/118, 143, 155
See application file for complete search history.

(56) References Cited

U.S. PATENT DOCUMENTS

| | | | |
|---|---|---|---|
| 7,535,392 B2 | 5/2009 | Weng et al. | |
| 7,982,647 B2 * | 7/2011 | Souda | H03M 3/37 341/143 |
| 9,035,813 B2 | 5/2015 | Miglani | |
| 9,106,255 B1 | 8/2015 | Zhang et al. | |
| 10,439,633 B2 | 10/2019 | Breems et al. | |
| 10,439,634 B2 | 10/2019 | Bolatkale et al. | |
| 10,727,859 B1 * | 7/2020 | Agrawal | H03M 3/448 |
| 2019/0149164 A1 | 5/2019 | Lien et al. | |
| 2019/0245553 A1 | 8/2019 | Bolatkale et al. | |
| 2021/0203350 A1 | 7/2021 | Ng et al. | |

OTHER PUBLICATIONS

U.S. Appl. No. 17/158,857, filed Jan. 26, 2021, entitled "Techniques for Linearizing Digital-To-Analog Converters in Sigma-Delta Analog-To-Digital Converters,".
Bolatkale, Muhammed et al., "A 4 GHz continuous-time Sigma-Delta ADC with 70 dB DR and -74 dBFS THD in 125 MHz BW," IEEE Journal of Solid-State Circuits, vol. 46, No. 12; Dec. 2011; pp. 2857-2868.

(Continued)

*Primary Examiner* — Khai M Nguyen

(57) ABSTRACT

The present disclosure relates generally to techniques for continuous-time sigma-delta analog-to-digital converter (ADC). The continuous-time sigma-delta ADC may include a feed-forward capacitor in parallel with a current-steering excess loop delay (ELD) digital-to-analog converter (DAC), and by creating a zero in a transfer function of a Gm cell, both an ELD feedback loop settling and a main feedback loop may be recovered. As a result, the performance and stability of the continuous-time sigma-delta ADC can be achieved. Additionally, a summation node in the continuous-time sigma-delta ADC may offer flexibility in the architecture design of the continuous-time sigma-delta ADC.

19 Claims, 7 Drawing Sheets

(56) References Cited

OTHER PUBLICATIONS

Cherry, J.A., et al., "Excess Loop Delay in Continuous-Time Delta-Sigma Modulators," IEEE Transactions on Circuits and Systems—II: Analog and Digital Signal Processing, vol. 46, No. 4, Apr. 1999; pp. 376-389.
Dong, Y. et al., "A Continuous-Time 0-3 MASH ADC achieving 88 dB DR With 53 MHz BW in 28 nm CMOS," IEEE Journal of Solid-State Circuits, vol. 49, No. 12; Dec. 2014; pp. 2868-2877.
Dong, Yunzhi et al., "A 72 dB-DR 465 MHz-BW Continuous-Time 1-2 MASH ADC in 28 nm CMOS," IEEE Journal of Solid-State Circuits, vol. 51, No. 12; Dec. 2016; pp. 2917-2927.
Jain, Ankesh et al., "Continuous-Time Delta-Sigma Modulators with Time-Interleaved FIR Feedback," IEEE Transactions on Circuits and Systems—I: Regular Papers, vol. 65, No. 2; Feb. 2018; pp. 434-442.
Srinivasan, Venkatesh et al., "A 20mW 61dB SNDR (60MHz BW) 1b Third-Order Continuous-Time Delta-Sigma Modulator Clocked at 6GHz in 45nm CMOS," 2012 IEEE International Solid-State Circuits Conference; Feb. 21, 2012; pp. 158-160.
Tang, Yongjian et al., "A 14 bit 200 MS/s DAC with SFDR > 78 dBc, IM3 > -83 dBc and NSD < -163 dBm/Hz Across the Whole Nyquist Band Enabled by Dynamic-Mismatch Mapping," IEEE Journal of Solid-State Circuits, vol. 46, No. 6; Jun. 2011; pp. 1371-1381.
Vadipour, Morteza, "Techniques for Preventing Tonal Behavior of Data Weighted Averaging Algorithm in Sigma-Delta Modulators," IEEE Transactions on Circuits and Systems—II: Analog and Digital Signal Processing, vol. 47, No. 11; Nov. 2000; pp. 1137-1144.
Wu, Su-Hai et al., "A 160MHz-BW 72dB-DR 40mW Continuous-Time Delta-Sigma Modulator in 16nm CMOS with Analog ISI Reduction Technique," IEEE International Solid-State Circuits Conference (ISSCC) Dig. Tech. Papers, 2016, pp. 280-281.
Yasuda, Akira et al., "A Third-Order Delta-Sigma Modulator Using Second-Order Noise-Shaping Dynamic Element Matching," IEEE Journal of Solid-State Circuits, vol. 33, No. 12; Dec. 1998; 8 pages.
Non-final office action dated Nov. 24, 2021 in U.S. Appl. No. 17/158,857.
Caldwell, T., "A Reconfigurable $\Delta\Sigma$ ADC With up to 100 MHz Bandwidth Using Flash Reference Shuffling", IEEE Transactions on Circuits and Systems—I: Regular Papers, vol. 61, No. 8, Aug. 2014.
Dayanik, M., "A 5GS/s 156MHz BW 70dB DR Continuous-Time Sigma-Delta Modulator with Time-Interleaved Reference Data-Weighted Averaging", 2017 Symposium on VLSI Circuits, Jun. 5-8, 2017.
Yang, W., "A 100mW 10MHz-BW CT $\Delta\Sigma$ Modulator with 87dB DR and 91dBc IMD", ISSCC 2008, Session 27, $\Delta\Sigma$ Data Converters, Mar. 3-7, 2008.
Zeng, T., "An Order-Statistics Based Matching Strategy for Circuit Components in Data Converters", IEEE Transactions on Circuits and Systems—I: Regular Papers, vol. 60, No. 1, Jan. 2013.
Baluni, A., "Analysis and Design of a 20-MHz Bandwidth Continuous-Time Delta-Sigma Modulator with Time-Interleaved Virtual-Ground-Switched FIR Feedback", IEEE Journal of Solid-State Circuits, vol. 56, No. 3, Mar. 2021.
Jain, A., "Continuous-Time Delta-Sigma Modulators with Time-Interleaved FIR Feedback," IEEE Transactions on Circuits and Systems—I: Regular Papers, vol. 65, No. 2; Feb. 2018; pp. 434-443, published Sep. 8, 2017.
Notice of Allowance dated Mar. 23, 2022 in U.S. Appl. No. 17/158,857.

\* cited by examiner

TECHNIQUES FOR HIGH-SPEED EXCESS LOOP DELAY COMPENSATION IN SIGMA-DELTA ANALOG-TO-DIGITAL CONVERTERS

BACKGROUND

Sigma-delta modulation is a useful technique for encoding analog signals into digital signals for an analog-to-digital converter (ADC). A sigma-delta ADC includes a feedback loop that is associated with a delay, referred to as an excess loop delay (ELD), wherein the ELD can be based on a number of factors, such as the regeneration time of an ADC quantizer, the propagation delay from the quantizer to the digital-to-analog converters (DACs) in the feedback loop, and delay of the DACs themselves. The ELD can impact overall ADC performance, such as in high-speed ADC applications. To reduce the impact of the ELD, a sigma-delta ADC may be configured with an excess loop delay (ELD) digital-to-analog converter (DAC). However, some ELD DAC may be sensitive to parasitic capacitance (e.g., on a summing node) associated with the sigma-delta ADC, and this parasitic capacitance may cause an incomplete settling of ELD feedback information. Additionally, or alternatively, the parasitic capacitance may cause a parasitic pole in a loop filter path of the sigma-delta ADC. These issues may degrade the performance of the sigma-delta ADC, and in some embodiments, may result in the sigma-delta ADC being unstable.

SUMMARY

The present disclosure relates to techniques for improving performance of a continuous-time sigma-delta ADC by providing improvements to DAC output settling speed in the continuous-time sigma-delta ADC.

According to one aspect, an apparatus for sigma-delta modulation is described. The apparatus may include a feedback path including a current digital-to-analog converter (IDAC); and a first capacitor coupled in parallel with the IDAC.

In some embodiments, the IDAC includes a second capacitor coupled in parallel with the IDAC.

In some embodiments, the IDAC comprises a current steering ELD DAC.

In some embodiments, the set of capacitors comprises at least two feedforward capacitors coupled in parallel with the IDAC. In some embodiments, an input and an output of the first feedforward capacitor is coupled to a first input and a first output of the IDAC. In some embodiments, an input and an output of the second feedforward capacitor is coupled to a second input and a second output of the IDAC.

In some embodiments, a first transconductance cell (Gm cell) is coupled to the IDAC, wherein a first output and a second output of the first Gm cell is coupled to a first output and a second output of the IDAC. In some embodiments, the apparatus may include a second Gm cell coupled to the first Gm cell, wherein a first output and a second output of the second Gm cell is coupled to a first output and a second output of the first Gm cell.

In some embodiments, the apparatus may include a latch coupled to the IDAC, the first Gm cell, the second Gm cell, or a DAC converter, or a combination thereof In some embodiments, the second Gm cell is configured to compensate a phase shift associated with one or more parasitic capacitances of a sigma-delta modulator associated with the apparatus.

In some embodiments, the apparatus may include a loop filter coupled to the first Gm cell.

In some embodiments, the apparatus may include a second IDAC coupled to the first transconductance cell, wherein a first output and a second output of the second IDAC are coupled to a first output and a second output of the first Gm cell. In some embodiments, the second IDAC is configured to receive a reference code and provide a reference current signal.

In some embodiments, a transfer function of the first Gm cell comprises a zero for compensating a phase shift.

In some embodiments, a capacitance value of the first capacitor is based on a parasitic capacitance associated with the current analog-to-digital converter.

According to another aspect, a sigma-delta ADC is described. The sigma-delta ADC may include a plurality of ELD DAC compensation loops, each ELD DAC compensation loop including an IDAC, and at least two capacitors coupled in parallel with the IDAC.

In some embodiments, a capacitance value of each capacitor of the at least two capacitors is based on a parasitic capacitance associated with the sigma-delta ADC.

In some embodiments, the sigma-delta ADC may include a first Gm cell coupled to the IDAC, and a second Gm cell coupled to the first Gm cell.

In some embodiments, each ELD DAC compensation loop comprises a one-bit comparator coupled to a latch of the sigma-delta analog-to-digital converter or a multibit comparator coupled to a plurality of latches of the sigma-delta analog-to-digital converter.

In some embodiments, the at least two capacitors are feedforward capacitors coupled in parallel with the IDAC.

According to another aspect, a method for sigma-delta modulation at a device is described. The method may include receiving a signal via a IDAC of the device, generating ELD feedback information based on compensating parasitic capacitance associated with a continuous-time sigma-delta ADC of the device using a set of capacitors coupled in parallel with the IDAC of the device, and outputting the generated ELD feedback information.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Various aspects of the present disclosure relate to techniques for improving performance of a continuous-time sigma-delta ADC by providing improvements DAC output settling speed in the continuous-time sigma-delta ADC. A sigma-delta ADC may be configured with an ELD DAC to mitigate issues due to excess loop delay, among other examples. However, the ELD DAC may be impacted by parasitic capacitance (e.g., on a summing node) associated with the sigma-delta ADC. For example, the parasitic capacitance may cause an incomplete settling of ELD feedback information. Further, the parasitic capacitance may also cause a parasitic pole in a loop filter path of the sigma-delta ADC. Additionally, or alternatively, a summing node may be employed at the input of a quantizer of some continuous-time sigma-delta ADC for system-level optimization. However, in some cases this summing node may limit the performance for the continuous-time sigma-delta ADC. To address the above issues, aspects of the present disclosure relate to a continuous-time sigma-delta ADC that includes a feed-forward capacitor in parallel with a current-steering ELD DAC, and by creating a zero in a transfer function of a Gm cell, both ELD feedback loop settling and main feedback loop (through loop filter) transfer function are recovered. As a result, the performance and stability of the continuous-time sigma-delta ADC can be achieved. Additionally, the summing node may offer flexibility in the architecture design of the continuous-time sigma-delta ADC.

Figure 1:
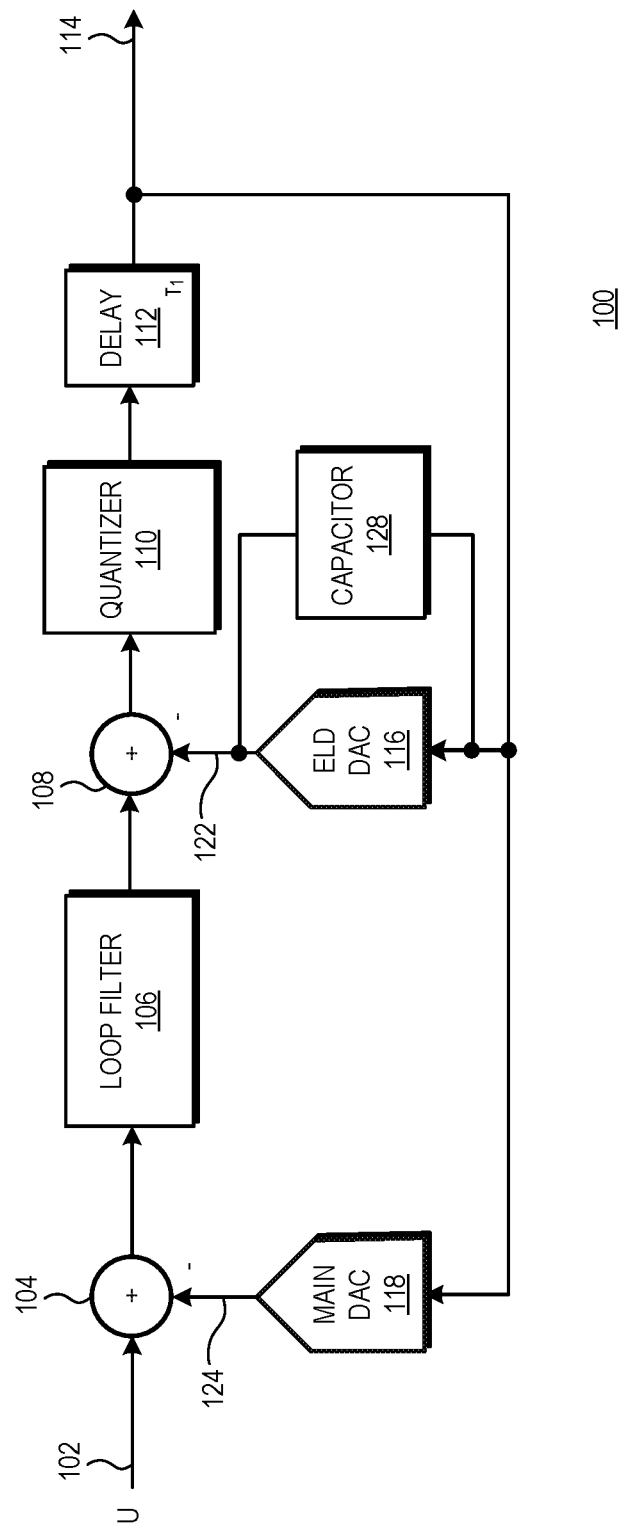
FIG. 1 is a block diagram of a continuous-time sigma-delta ADC in accordance with some embodiments.

FIG. 1 is a block diagram of a continuous-time sigma-delta ADC 100 in accordance with some embodiments. In the following description of the continuous-time sigma-delta ADC 100, certain components may be added or omitted from the continuous-time sigma-delta ADC 100. The continuous-time sigma-delta ADC 100 may support analog-to-digital conversion of signals by processing a signal over one or more components of the continuous-time sigma-delta ADC 100. In the example of FIG. 1, the components of the continuous-time sigma-delta ADC 100 may include, but is not limited to, a set of summing nodes (e.g., a summing node 104, a summing node 108), a loop filter 106, a quantizer 110 associated with a corresponding delay 112, an ELD DAC 116, and a main DAC 118.

The set of summing nodes (e.g., the summing node 104, the summing node 108) may be configured to add or subtract signals of the continuous-time sigma-delta ADC 100. The loop filter 106, the quantizer 110, the ELD DAC 116, and the main DAC 118 may be configured to process (e.g., filter, amplify, convert, feed-back, etc.) signals of the continuous-time sigma-delta ADC 100. The loop filter 106, the quantizer 110, the ELD DAC 116, and the main DAC 118 may be made up of one or more circuit elements (e.g., one or more resistors, capacitors, inductors, etc.). The continuous-time sigma-delta ADC 100 may also include a capacitor 128 (e.g., one or more capacitors) that may be configured to cancel, compensate, mitigate, etc. parasitic capacitance of the continuous-time sigma-delta ADC 100.

The components of the continuous-time sigma-delta ADC 100 may be coupled (e.g., operatively, communicatively, functionally, electronically) to each other. The components of the continuous-time sigma-delta ADC 100 may include one or more inputs and one or more outputs for coupling to other components of the continuous-time sigma-delta ADC 100. The summing node 104 may include one or more inputs, such as a first input to receive a signal (e.g., an input signal 102) and a second input coupled to an output of the main DAC 118 to receive another signal (e.g., a main DAC feedback signal 124) from the main DAC 118. The summing node 104 may also include an output coupled to an input of the loop filter 106 to output a signal to the loop filter 106.

The summing node 108 may include a first input coupled to an output of the loop filter 106, and a second input coupled to an output of the ELD DAC 116 to receive another signal (e.g., an ELD DAC feedback signal 122). The quantizer 110 may include an input, for example, coupled to an output of the summing node 108 to receive a signal from the summing node 108. The quantizer 110 may also include an output that is coupled to an input of the delay 112 to output a signal to the delay 112, which may include one or more outputs including a first output to provide an output signal 114 and a second output coupled to an input of the ELD DAC 116 to output a signal to the ELD DAC 116 and an input to the main DAC 118 to output a signal to the main DAC 118.

In the example of FIG. 1, the summing node 104 may receive, via the first input, an input signal 102, which may be an analog signal. The summing node 104 may also receive, via the second input, a main DAC feedback signal 124 from the output of the main DAC 118. The summing node 104 may be configured to add or subtract signals, for example, add or subtract the input signal 102 from the main DAC feedback signal 124 to produce a resultant signal. The summing node 104 may provide, via the output of the summing node 104, the resultant signal to the input of the loop filter 106. The loop filter 106 may be made up of one or more circuit elements. For example, the loop filter 106 may be made up of one or more resistors and capacitors. The loop filter 106 may also be associated with a respective transfer function that models the continuous-time sigma-delta ADC 100.

The loop filter 106 may provide, via the output of the loop filter 106, a filtered signal to the first input of the summing node 108. The summing node 108 may also receive, via the second input, an ELD DAC feedback signal 122 from the output of the ELD DAC 116. The summing node 108 may be configured to add or subtract signals, for example, add or subtract the filtered signal from the ELD DAC feedback signal 122 to produce a resultant signal. The summing node 108 may provide, via the output of the summing node 108, the resultant signal to the input of the quantizer 110. The quantizer 110 may convert the analog output of the loop filter 106 into digital code. For example, the analog signal output from the summing node 108 may be input to the quantizer 110 (e.g., a multibit quantizer) and an input to the delay 112 associated with the quantizer 110 ($\pi_1$ is the delay 112 of the quantizer 110). The output of the delay 112 may be the output signal 114 of the continuous-time sigma-delta ADC 100.

The continuous-time sigma-delta ADC 100 includes a feedback loop comprising the loop filter 106, the quantizer 110, the ELD DAC 116, and the main DAC 118. In very high-speed sigma-delta ADCs with up to several GHz sampling rate, the delay in the feedback loop cannot be neglected. To maintain the stability of the continuous-time sigma-delta ADC 100 and to restore the optimal performance, an improved ELD compensation technique is needed. The ELD is compensated by building up a direct feedback loop from the output to the input of the quantizer 110 through the ELD DAC 116. In some embodiments, the summing node 108 at the input of the quantizer 110 may be needed for the optimization of the thermal noise at the internal nodes of the loop filter 106. In some other embodiments, the summing node 108 at the input of the quantizer 110 may be needed for the optimization of the signal transfer function. In other embodiments, the summing node 108 at the input of the quantizer 110 may be needed for a feedforward loop filter architecture. The capacitor 128 (i.e., a feedforward capacitor) may be coupled in parallel with the ELD DAC 116 to improve the output settling speed of the ELD DAC 116 and to restore the optimal performance as described herein.

Figure 2:
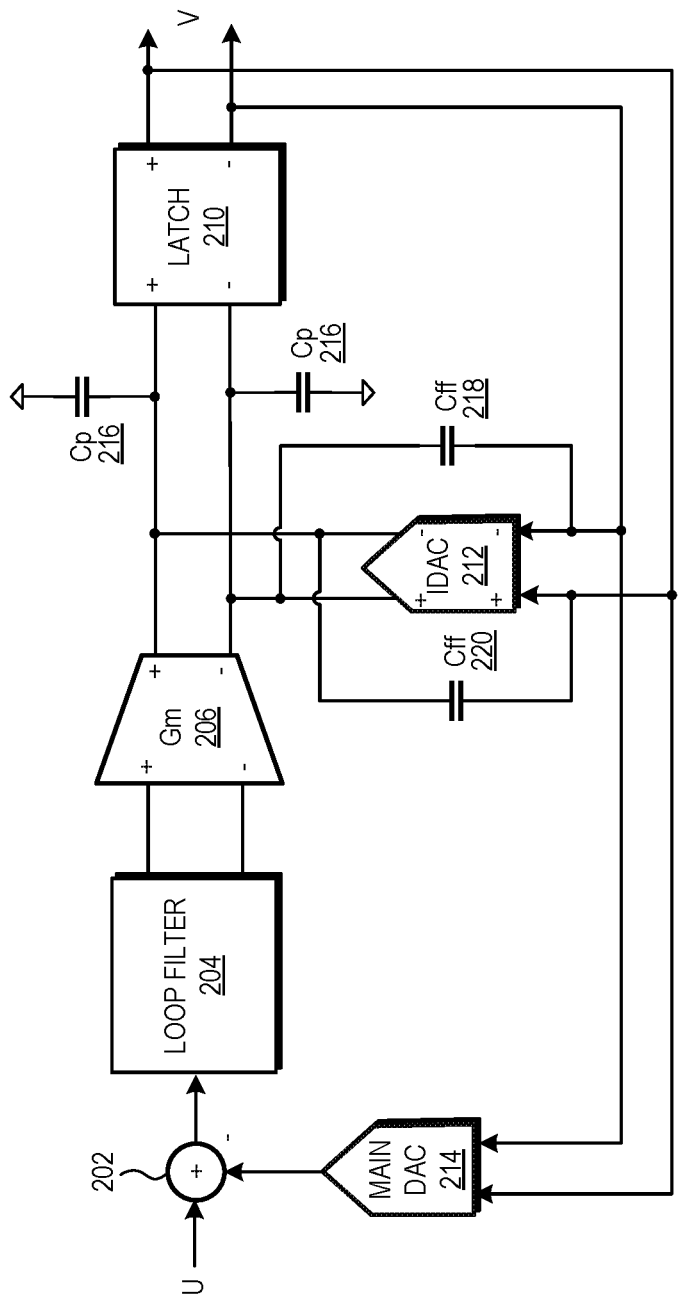
FIG. 2 is a block diagram of a continuous-time sigma-delta ADC in accordance with some embodiments.

FIG. 2 is a block diagram of a continuous-time sigma-delta ADC 200 in accordance with some embodiments. In the following description of the continuous-time sigma-delta ADC 200, certain components may be added or omitted from the continuous-time sigma-delta ADC 200. The continuous-time sigma-delta ADC 200 may implement aspects of the continuous-time sigma-delta ADC 100 as described in FIG. 1. For example, the continuous-time sigma-delta ADC 200 may implement a 1-bit quantization. The continuous-time sigma-delta ADC 200 may support analog-to-digital conversion of signals by processing a signal over one or more components of the continuous-time sigma-delta ADC 200.

In the example of FIG. 2, the components of the continuous-time sigma-delta ADC 200 may include, but is not limited to, a summing node (e.g., a summing node 202), a loop filter 204, a Gm cell 206, a latch 210, a current steering ELD DAC (IDAC) 212, and a main DAC 214. The summing node 202 may be configured to add or subtract signals of the continuous-time sigma-delta ADC 200. The loop filter 204, the Gm cell 206, the latch 210, the IDAC 212, and the main DAC 214 may be configured to process signals of the continuous-time sigma-delta ADC 200. The loop filter 204, the Gm cell 206, the latch 210, the IDAC 212, and the main DAC 214 may be made up of one or more circuit elements (e.g., one or more resistors, capacitors, inductors, etc.).

The components of the continuous-time sigma-delta ADC 200 may be coupled (e.g., operatively, communicatively, functionally, electronically) to each other. The components of the continuous-time sigma-delta ADC 200 may include one or more inputs and one or more outputs for coupling to other components of the continuous-time sigma-delta ADC 200. The summing node 202 may include one or more inputs, such as a first input to receive a signal (e.g., an input signal U) and a second input coupled to an output of the main DAC 214 to receive another signal (e.g., a main DAC feedback signal) from the main DAC 214. The summing node 202 may also include an output coupled to an input of the loop filter 204, which may include a set of outputs including a first output coupled to a first input of the Gm cell 206 and a second output coupled to a second input of the GM cell 206. The Gm cell 206 may include a set of inputs and a set of outputs. For example, the Gm cell 206 may include a first output coupled to a first input of the latch 210, while a second output of the Gm cell 206 may be coupled to a second input of the latch 210. The latch 210 may include a set of outputs including a first output and a second output operable to provide an output signal (e.g., a digital signal).

In some embodiments, the first output of the latch 210 may be coupled to a first input of the IDAC 212 and the second output of the latch 210 may be coupled to a second input of the IDAC 212. The IDAC 212 may include a first output coupled to the first output of the Gm cell 206 and a second output coupled to the second output of the Gm cell 206. The IDAC 212 may output a ELD DAC feedback signal to the first output of the Gm cell 206 and the second output coupled to the second output of the Gm cell 206. In some embodiments, the first output of the latch 210 may be coupled to a first input of the main DAC 214 and the second output of the latch 210 may be coupled to a second input of the main DAC 214. The main DAC 214 may output a main DAC feedback signal via an output of the main DAC 214 to the second input of the summing node 202.

In the example of FIG. 2, the continuous-time sigma-delta ADC 200 may include a first feedforward capacitor $C_{ff}$ 218 and a second feedforward capacitor $C_{ff}$ 220 in parallel with the IDAC 212. That is, the feedforward capacitors $C_{ff}$ 218, 220 are added between the input and output nodes of the IDAC 212 to boost up settling of the ELD feedback information from the IDAC 212. The capacitance value of the feedforward capacitors $C_{ff}$ 218, 220 may be preconfigured. Alternatively, a capacitance value of the feedforward capacitors $C_{ff}$ 218, 220 may be based on a parasitic capacitance associated with the continuous-time sigma-delta ADC 200. In some embodiments, in the example of FIG. 2, the continuous-time sigma-delta ADC 200 may include a zero built Gm cell (e.g., the Gm cell 206) having a zero in a transfer function of the Gm cell. The zero built Gm cell may compensate a phase shift of the parasitic pole caused by the parasitic capacitances $C_p$ 216 and the Gm cell 206. As a result, the issues caused by the parasitic capacitances $C_p$ 216 on both the ELD path and the loop filter path are compensated.

Figure 3:
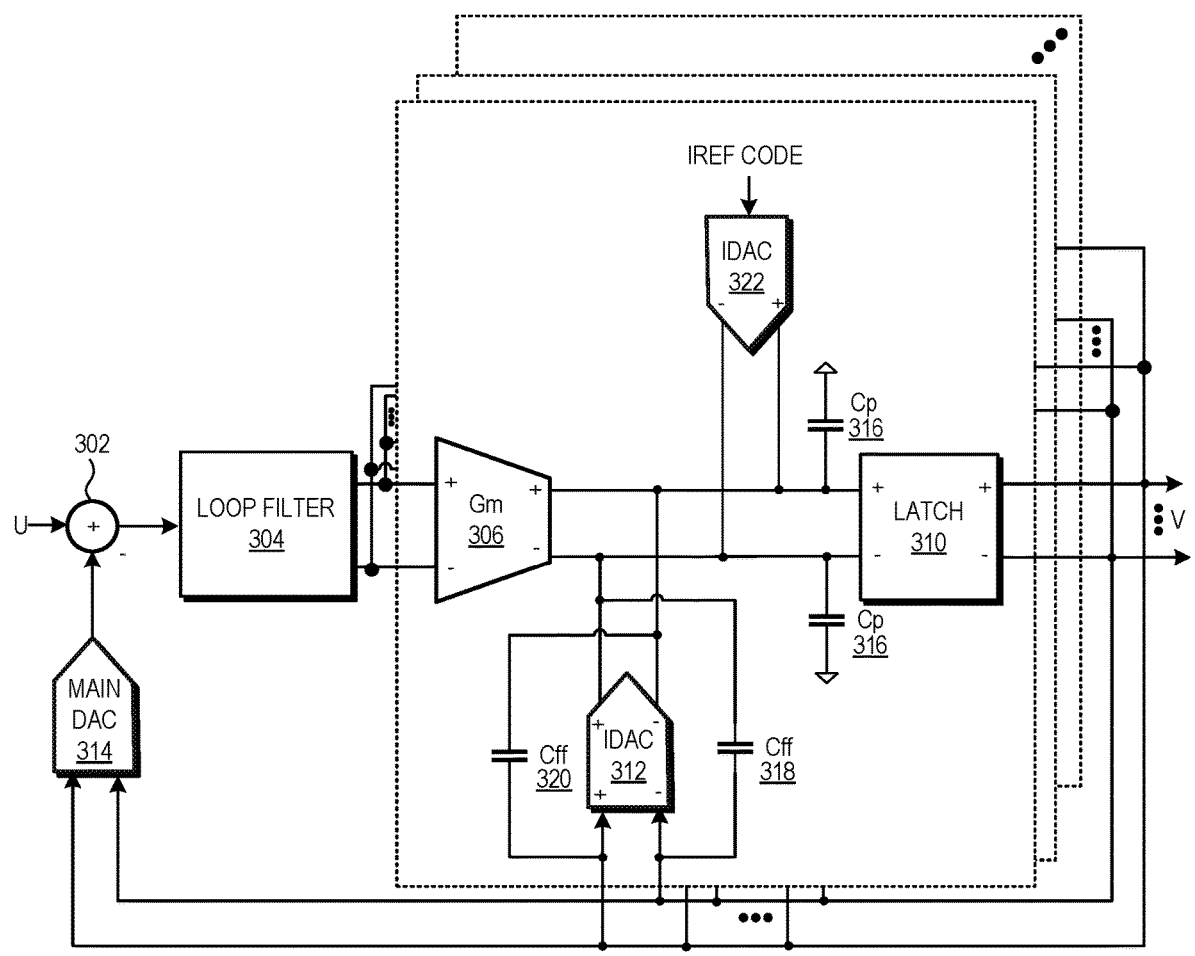
FIG. 3 is a block diagram of a continuous-time sigma-delta ADC in accordance with some embodiments.

FIG. 3 is a block diagram of a continuous-time sigma-delta ADC 300 in accordance with some embodiments. In the following description of the continuous-time sigma-delta ADC 300, certain components may be added or omitted from the continuous-time sigma-delta ADC 300. The continuous-time sigma-delta ADC 300 may implement aspects of the continuous-time sigma-delta ADC 100 as described in FIG. 1. For example, the continuous-time sigma-delta ADC 300 may implement a multi-bit quantization. The continuous-time sigma-delta ADC 300 may support analog-to-digital conversion of signals by processing a signal over one or more components of the continuous-time sigma-delta ADC 300. In the example of FIG. 3, the components of the continuous-time sigma-delta ADC 300 may include, but is not limited to, a summing node (e.g., a summing node 302), a loop filter 304, a Gm cell 306, a latch 310, an IDAC 312, a main DAC 314, and an IDAC 322. The summing node 302 may be configured to add or subtract signals of the continuous-time sigma-delta ADC 300. The loop filter 304, the Gm cell 306, the latch 310, the IDAC 312, the main DAC 314, and the IDAC 322 may be made up of one or more circuit elements (e.g., one or more resistors, capacitors, inductors, etc.).

The components of the continuous-time sigma-delta ADC 300 may be coupled (e.g., operatively, communicatively, functionally, electronically) to each other. The components of the continuous-time sigma-delta ADC 300 may include one or more inputs and one or more outputs for coupling to other components of the continuous-time sigma-delta ADC 300. The summing node 302 may include one or more inputs, such as a first input to receive a signal (e.g., an input signal U) and a second input coupled to an output of the main DAC 314 to receive another signal (e.g., a main DAC feedback signal) from the main DAC 314. The summing node 302 may also include an output coupled to an input of the loop filter 304, which may include a set of outputs including a first output coupled to a first input of the Gm cell 306 and a second output coupled to a second input of the Gm cell 306. The Gm cell 306 may include a set of outputs. For example, the Gm cell 306 may include a first output coupled to a first input of the latch 310, while a second output of the Gm cell 306 may be coupled to a second input of the latch 310. The latch 310 may include a set of outputs including a first output and a second output operable to output an output signal (e.g., a digital signal).

In some embodiments, the first output of the latch 310 may be coupled to a first input of the IDAC 312 and the second output of the latch 310 may be coupled to a second input of the IDAC 312. The IDAC 312 may include a first output coupled to the first output of the Gm cell 306 and a second output coupled to the second output of the Gm cell 306. The IDAC 312 may output a ELD DAC feedback signal to the first output of the Gm cell 306 and the second output coupled to the second output of the Gm cell 306.

In some embodiments, the first output of the latch 310 may be coupled to a first input of the main DAC 314 and the second output of the latch 310 may be coupled to a second input of the main DAC 314.

The main DAC 314 may output a main DAC feedback signal via an output of the main DAC 314 to the second input of the summing node 302. The IDAC 322 may include an input to receive a reference current code. The reference current code may correspond to a reference current. The reference current may be designed to have the same common-mode current for every slice of the continuous-time sigma-delta ADC 300. The IDAC 322 may include a first output coupled to the first output of the Gm cell 306 and a second output coupled to the second output of the Gm cell 306 to receive a reference code and provide a reference current signal.

In the example of FIG. 3, the continuous-time sigma-delta ADC 300 may include a first feedforward capacitor $C_{ff}$ 318 and a second feedforward capacitor $C_{ff}$ 320 in parallel with the IDAC 312. The feedforward capacitors $C_{ff}$ 318, 320 are thereby added between the input and output nodes of the IDAC 312 to boost up settling of the ELD feedback information from the IDAC 312. In some embodiments, in the example of FIG. 3, the continuous-time sigma-delta ADC 300 may include a zero built Gm cell (e.g., the Gm cell 306) having a zero in a transfer function of the Gm cell. The zero built Gm cell may compensate a phase shift of the parasitic pole caused by the parasitic capacitances $C_p$ 316 and the Gm cell 306. As a result, the issues caused by the parasitic capacitances $C_p$ 316 on both the ELD path and the loop filter path are compensated.

Figure 4:
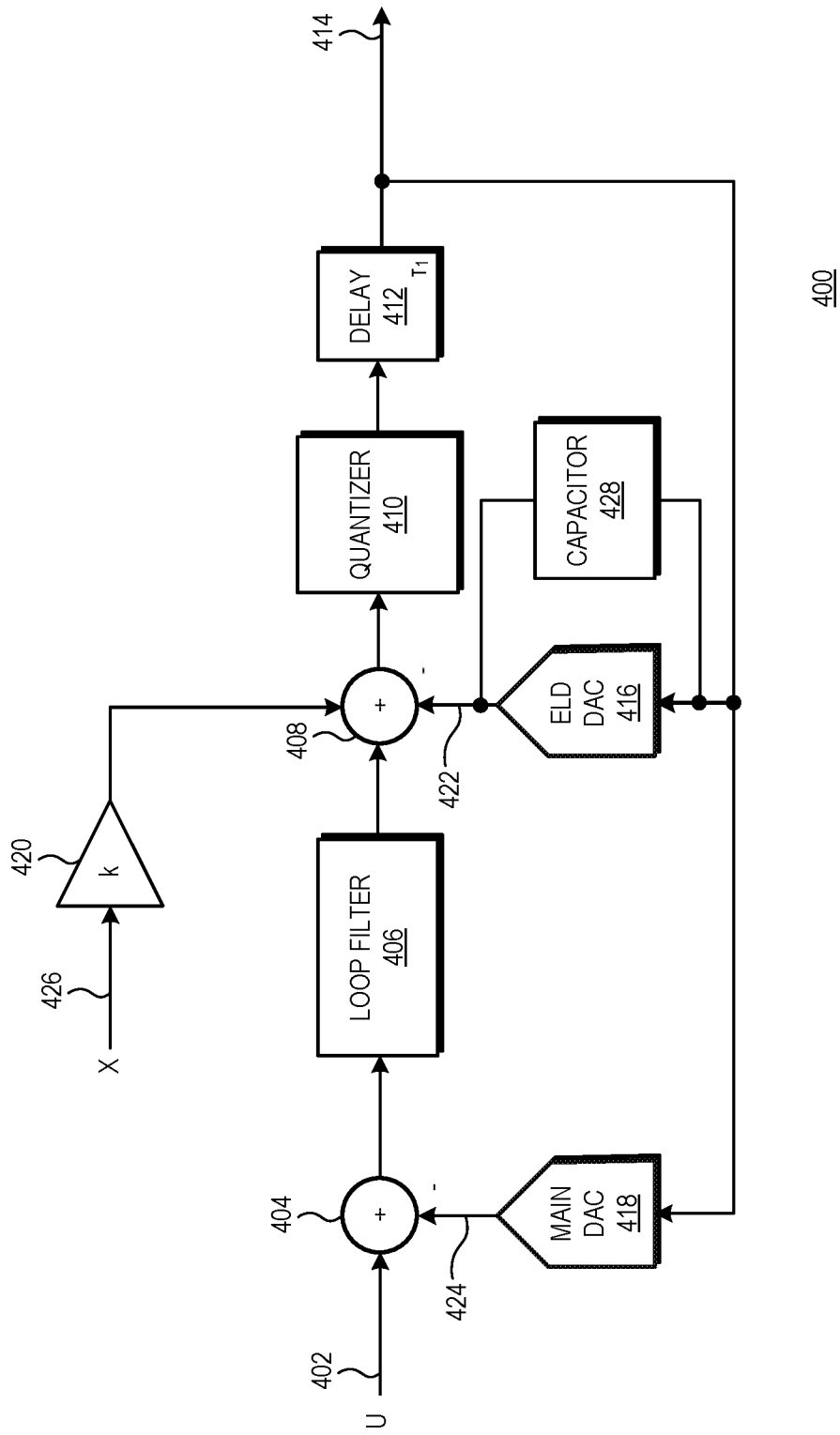
FIG. 4 is a block diagram of a continuous-time sigma-delta ADC in accordance with some embodiments.

FIG. 4 is a block diagram of a continuous-time sigma-delta ADC 400 in accordance with some embodiments. In the following description of the continuous-time sigma-delta ADC 400, certain components may be added or omitted from the continuous-time sigma-delta ADC 400. The continuous-time sigma-delta ADC 400 may support analog-to-digital conversion of signals by processing a signal over one or more components of the continuous-time sigma-delta ADC 400. In the example of FIG. 4, the components of the continuous-time sigma-delta ADC 400 may include, but is not limited to, a set of summing nodes (e.g., a summing node 404, a summing node 408), a loop filter 406, a quantizer 410 associated with a corresponding delay 412, an ELD DAC 416, a main DAC 418, and an amplifier 420. The set of summing nodes (e.g., the summing node 404, the summing node 408) may be configured to add or subtract signals of the continuous-time sigma-delta ADC 400. The loop filter 406, the quantizer 410, the ELD DAC 416, the main DAC 418, and the amplifier 420 may be configured to process (e.g., filter, amplify, convert, feed-back, etc.) signals of the continuous-time sigma-delta ADC 400. The loop filter 406, the quantizer 410, the ELD DAC 416, the main DAC 418, and the amplifier 420 may be made up of one or more circuit elements (e.g., one or more resistors, capacitors, inductors, etc.). The capacitor 428 may be configured to cancel, compensate, mitigate, etc. parasitic capacitance of the continuous-time sigma-delta ADC 400.

The components of the continuous-time sigma-delta ADC 400 may be coupled (e.g., operatively, communicatively, functionally, electronically) to each other. The components of the continuous-time sigma-delta ADC 400 may include one or more inputs and one or more outputs for coupling to other components of the continuous-time sigma-delta ADC 400. The summing node 404 may include one or more inputs, such as a first input to receive a signal (e.g., an input signal 402) and a second input coupled to an output of the main DAC 418 to receive another signal (e.g., a main DAC feedback signal 424) from the main DAC 418. The summing node 404 may also include an output coupled to an input of the loop filter 406 to output a signal to the loop filter 406.

The summing node 408 may include a first input coupled to an output of the loop filter 406, a second input coupled to an output of the ELD DAC 416 to receive another signal (e.g., an ELD DAC feedback signal 422), and a third input coupled to an output of the amplifier 420. The amplifier 420 may include an input to receive a signal (e.g., an input signal 426). The input signal 426 (signal X) may equal the sigma-delta ADC input 402 (signal U), or an internal signal of the loop filter 406. The quantizer 410 may include an input, for example, coupled to an output of the summing node 408 to receive a signal from the summing node 408. The quantizer 410 may also include an output that is coupled to an input of the delay 412 to output a signal to the delay 412, which may include one or more outputs including a first output to provide an output signal 414 and a second output coupled to an input of the ELD DAC 416 to output a signal to the ELD DAC 416 and an input to the main DAC 418 to output a signal to the main DAC 418.

In the example of FIG. 4, the summing node 404 may receive, via the first input, an input signal 402, which may be an analog signal. The summing node 404 may also receive, via the second input, a main DAC feedback signal 424 from the output of the main DAC 418. The summing node 404 may be configured to add or subtract signals, for example, add or subtract the input signal 402 from the main DAC feedback signal 424 to produce a resultant signal. The summing node 404 may provide, via the output of the summing node 404, the resultant signal to the input of the loop filter 406. The loop filter 406 may be made up of one or more circuit elements. For example, the loop filter 406 may be made up of one or more resistors and capacitors. The loop filter 406 may also be associated with a respective transfer function that models the continuous-time sigma-delta ADC 400.

The loop filter 406 may provide, via the output of the loop filter 406, a filtered signal to the first input of the summing node 408. The summing node 408 may also receive, via the second input, an ELD DAC feedback signal 422 from the output of the ELD DAC 416. The summing node 408 may be configured to add or subtract signals, for example, add or subtract the filtered signal from the ELD DAC feedback signal 422 or the amplified signal from the amplifier 420 to produce a resultant signal. The summing node 408 may provide, via the output of the summing node 408, the resultant signal to the input of the quantizer 410. The quantizer 410 may convert the analog output of the loop filter 406 into digital code. For example, the analog signal output from the summing node 408 may be input to the quantizer 410 (e.g., a multibit quantizer) and an input to the delay 412 associated with the quantizer 410 ($\pi_1$ is the delay 412 of the quantizer 410). The output of the delay 412 may be the output signal 414 of the continuous-time sigma-delta ADC 400.

The continuous-time sigma-delta ADC 400 includes a feedback loop comprising the loop filter 406, the quantizer 410, the ELD DAC 416, and the main DAC 418. In very high-speed sigma-delta ADCs with up to several GHz sampling rate, the delay in the feedback loop cannot be neglected. To maintain the stability of the continuous-time sigma-delta ADC 400 and to restore the optimal performance, an improved ELD compensation technique is needed. The ELD is compensated by building up a direct feedback loop from the output to the input of the quantizer 410 through the ELD DAC 416. In some embodiments, the summing node 408 at the input of the quantizer 410 may be needed for the optimization of the thermal noise at the internal nodes of the loop filter 406. In some other embodiments, the summing node 408 at the input of the quantizer 410 may be needed for the optimization of the signal transfer function. In other embodiments, the summing node 408 at the input of the quantizer 410 may be needed for a feedforward loop filter architecture. The capacitor 428 may be coupled in parallel with the ELD DAC 416 to improve the output settling speed of the ELD DAC 416 and to restore the optimal performance as described herein. In some embodiments, the summing node 408 may be implemented as a current summation in FIG. 5 as described herein. In some embodiments, the summing node 408 may be implemented as a current summation in FIG. 6 as described herein.

Figure 5:
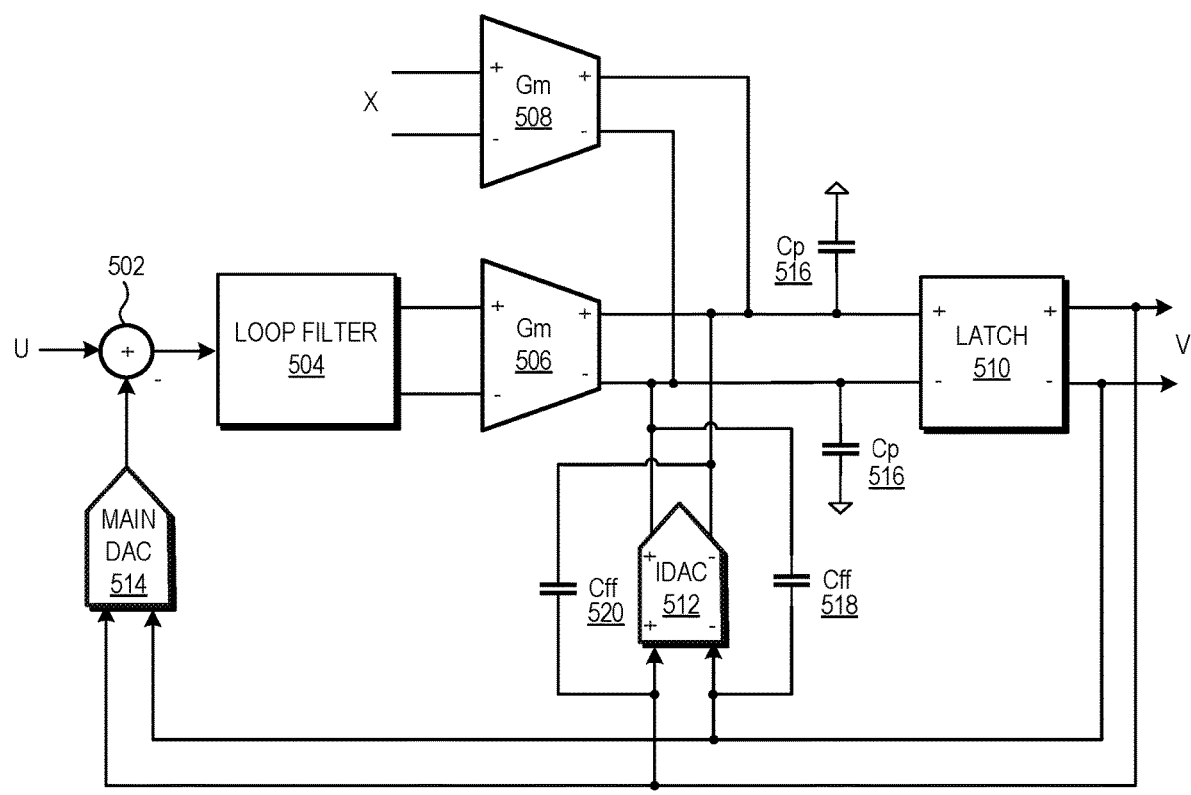
FIG. 5 is a block diagram of a continuous-time sigma-delta ADC in accordance with some embodiments.

FIG. 5 is a block diagram of a continuous-time sigma-delta ADC 500 in accordance with some embodiments. In the following description of the continuous-time sigma-delta ADC 500, certain components may be added or omitted from the continuous-time sigma-delta ADC 500. The continuous-time sigma-delta ADC 500 may implement aspects of the continuous-time sigma-delta ADC 400 as described in FIG. 4. For example, the continuous-time sigma-delta ADC 500 may implement a 1-bit quantization. The continuous-time sigma-delta ADC 500 may implement a generic summation node and an ELD compensation technique for a 1-bit quantization.

The continuous-time sigma-delta ADC 500 may support analog-to-digital conversion of signals by processing a signal over one or more components of the continuous-time sigma-delta ADC 500. In the example of FIG. 5, the components of the continuous-time sigma-delta ADC 500 may include, but is not limited to, a summing node (e.g., a summing node 502), a loop filter 504, a Gm cell 506, a Gm cell 508, a latch 510, a current steering ELD DAC (IDAC) 512, and a main DAC 514. The summing node 502 may be configured to add or subtract signals of the continuous-time sigma-delta ADC 500. The loop filter 504, the Gm cell 506, the Gm cell 508, the latch 510, the IDAC 512, and the main DAC 514 may be configured to process signals of the continuous-time sigma-delta ADC 500. The loop filter 504, the Gm cell 506, the Gm cell 508, the latch 510, the IDAC 512, and the main DAC 514 may be made up of one or more circuit elements (e.g., one or more resistors, capacitors, inductors, etc.).

The components of the continuous-time sigma-delta ADC 500 may be coupled (e.g., operatively, communicatively, functionally, electronically) to each other. The components of the continuous-time sigma-delta ADC 500 may include one or more inputs and one or more outputs for coupling to other components of the continuous-time sigma-delta ADC 500. The summing node 502 may include one or more inputs, such as a first input to receive a signal (e.g., an input signal U) and a second input coupled to an output of the main DAC 514 to receive another signal (e.g., a main DAC feedback signal) from the main DAC 514. The summing node 502 may also include an output coupled to an input of the loop filter 504, which may include a set of outputs including a first output coupled to a first input of the Gm cell 506 and a second output coupled to a second input of the GM cell 506.

The Gm cell 508 may include a set of inputs and a set of outputs. For example, the Gm cell 508 may include a first input and a second input operable to receive an input signal (e.g., an input signal X), and a first output and a second output coupled to a first output of the Gm cell 506 and a second output of the Gm cell 506. The first output of the Gm cell 506 may be coupled to a first input of the latch 510, while the second output of the Gm cell 506 may be coupled to a second input of the latch 510. The latch 510 may include a set of outputs including a first output and a second output operable to provide an output signal (e.g., a digital signal).

In some embodiments, the first output of the latch 510 may be coupled to a first input of the IDAC 512 and the second output of the latch 510 may be coupled to a second input of the IDAC 512. The IDAC 512 may include a first output coupled to the first output of the Gm cell 506 and a second output coupled to the second output of the Gm cell 506. The IDAC 512 may output a ELD DAC feedback signal to the first output of the Gm cell 506 and the second output coupled to the second output of the Gm cell 506. In some embodiments, the first output of the latch 510 may be coupled to a first input of the main DAC 514 and the second output of the latch 510 may be coupled to a second input of the main DAC 514. The main DAC 514 may output a main DAC feedback signal via an output of the main DAC 514 to the second input of the summing node 502.

In the example of FIG. 5, the continuous-time sigma-delta ADC 500 may include a first feedforward capacitor $C_{ff}$ 518 and a second feedforward capacitor $C_{ff}$ 520 in parallel with the IDAC 512. That is, the feedforward capacitors $C_{ff}$ 518, 520 are added between the input and output nodes of the IDAC 512 to boost up settling of the ELD feedback information from the IDAC 512. The capacitance value of the feedforward capacitors $C_{ff}$ 518, 520 may be preconfigured. Alternatively, a capacitance value of the feedforward capacitors $C_{ff}$ 518, 520 may be based on a parasitic capacitance associated with the continuous-time sigma-delta ADC 500. In some embodiments, in the example of FIG. 5, the continuous-time sigma-delta ADC 500 may include a zero built Gm cell (e.g., the Gm cell 506 or the Gm cell 508) having a zero in a transfer function of the Gm cell. The zero built Gm cells may compensate a phase shift of the parasitic pole caused by the parasitic capacitances $C_p$ 516 and the Gm cells 506, 508. As a result, the issues caused by the parasitic capacitances $C_p$ 516 on both the ELD path and the loop filter path are compensated.

Figure 6:
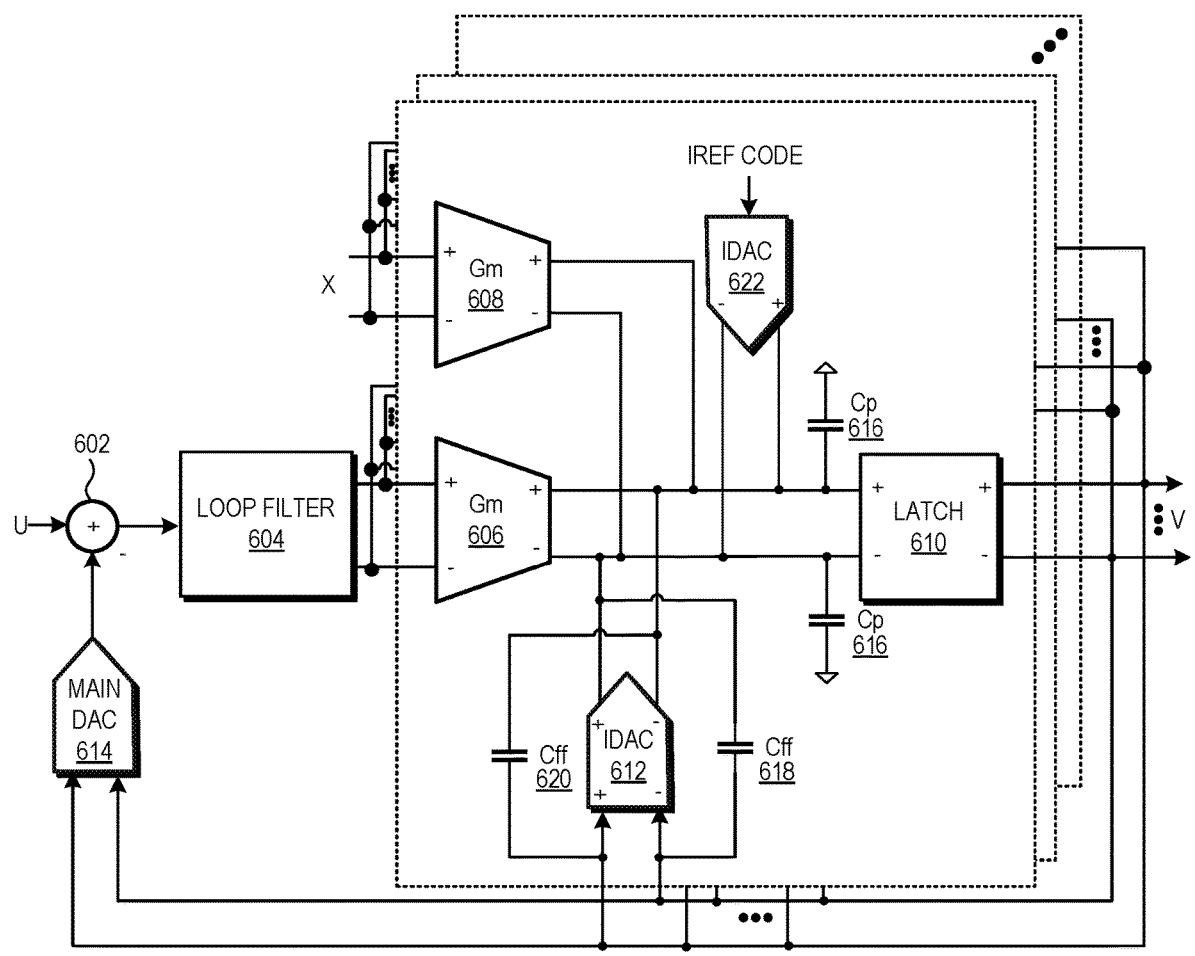
FIG. 6 is a block diagram of a continuous-time sigma-delta ADC in accordance with some embodiments.

FIG. 6 is a block diagram of a continuous-time sigma-delta ADC 600 in accordance with some embodiments. In the following description of the continuous-time sigma-delta ADC 600, certain components may be added or omitted from the continuous-time sigma-delta ADC 600. The continuous-time sigma-delta ADC 600 may implement aspects of the continuous-time sigma-delta ADC 400 as described in FIG. 4. For example, the continuous-time sigma-delta ADC 600 may implement a multi-bit quantization. The continuous-time sigma-delta ADC 600 may implement a generic summation node and an ELD compensation technique for multi-bit quantization. The continuous-time sigma-delta ADC 600 may thus include multiple slices.

The continuous-time sigma-delta ADC 600 may support analog-to-digital conversion of signals by processing a signal over one or more components of the continuous-time sigma-delta ADC 600. In the example of FIG. 6, the components of the continuous-time sigma-delta ADC 600 may include, but is not limited to, a summing node (e.g., a summing node 602), a loop filter 604, a Gm cell 606, a Gm cell 608, a latch 610, an IDAC 612, a main DAC 614, and an IDAC 622. The summing node 602 may be configured to add or subtract signals of the continuous-time sigma-delta ADC 600. The loop filter 604, the Gm cell 606, the Gm cell 608, the latch 610, the IDAC 612, the main DAC 614, and the IDAC 622 may be made up of one or more circuit elements (e.g., one or more resistors, capacitors, inductors, etc.).

The components of the continuous-time sigma-delta ADC 600 may be coupled (e.g., operatively, communicatively, functionally, electronically) to each other. The components of the continuous-time sigma-delta ADC 600 may include one or more inputs and one or more outputs for coupling to other components of the continuous-time sigma-delta ADC 600. The summing node 602 may include one or more inputs, such as a first input to receive a signal (e.g., an input signal U) and a second input coupled to an output of the main DAC 614 to receive another signal (e.g., a main DAC feedback signal) from the main DAC 614. The summing node 602 may also include an output coupled to an input of the loop filter 604, which may include a set of outputs including a first output coupled to a first input of the Gm cell 606 and a second output coupled to a second input of the Gm cell 606.

The Gm cell 608 may include a set of inputs and a set of outputs. For example, the Gm cell 608 may include a first input and a second input operable to receive an input signal (e.g., an input signal X), and a first output and a second output coupled to a first output of the Gm cell 606 and a second output of the Gm cell 606. The first output of the Gm cell 606 may be coupled to a first input of the latch 610, while the second output of the Gm cell 606 may be coupled to a second input of the latch 610. The latch 610 may include a set of outputs including a first output and a second output operable to output an output signal (e.g., a digital signal).

In some embodiments, the first output of the latch 610 may be coupled to a first input of the IDAC 612 and the second output of the latch 610 may be coupled to a second input of the IDAC 612. The IDAC 612 may include a first output coupled to the first output of the Gm cell 606 and a second output coupled to the second output of the Gm cell 606. The IDAC 612 may output a ELD DAC feedback signal to the first output of the Gm cell 606 and the second output coupled to the second output of the Gm cell 606. In some embodiments, the first output of the latch 610 may be coupled to a first input of the main DAC 614 and the second output of the latch 610 may be coupled to a second input of the main DAC 614. The main DAC 614 may output a main DAC feedback signal via an output of the main DAC 614 to the second input of the summing node 602. The IDAC 622 may include an input to receive a reference current code. The reference current code may correspond to a reference current. The reference current may be designed to have the same common-mode current for every slice of the continuous-time sigma-delta ADC 600. The IDAC 622 may include a first output coupled to the first output of the Gm cell 606 and a second output coupled to the second output of the Gm cell 606 to receive a reference code and provide a reference current signal.

In the example of FIG. 6, the continuous-time sigma-delta ADC 600 may include a first feedforward capacitor $C_{ff}$ 618 and a second feedforward capacitor $C_{ff}$ 620 in parallel with the IDAC 612. The feedforward capacitors $C_{ff}$ 618, 620 are thereby added between the input and output nodes of the IDAC 612 to boost up settling of the ELD feedback information from the IDAC 612. In some embodiments, in the example of FIG. 6, the continuous-time sigma-delta ADC 600 may include a second zero built Gm cell (e.g., the Gm cell 606 or the Gm cell 608) having a zero in a transfer function of the Gm cell. The zero built Gm cells may compensate a phase shift of the parasitic pole caused by the parasitic capacitances $C_p$ 616 and the Gm cells 606, 608. As a result, the issues caused by the parasitic capacitances $C_p$ 616 on both the ELD path and the loop filter path are compensated.

Figure 7:
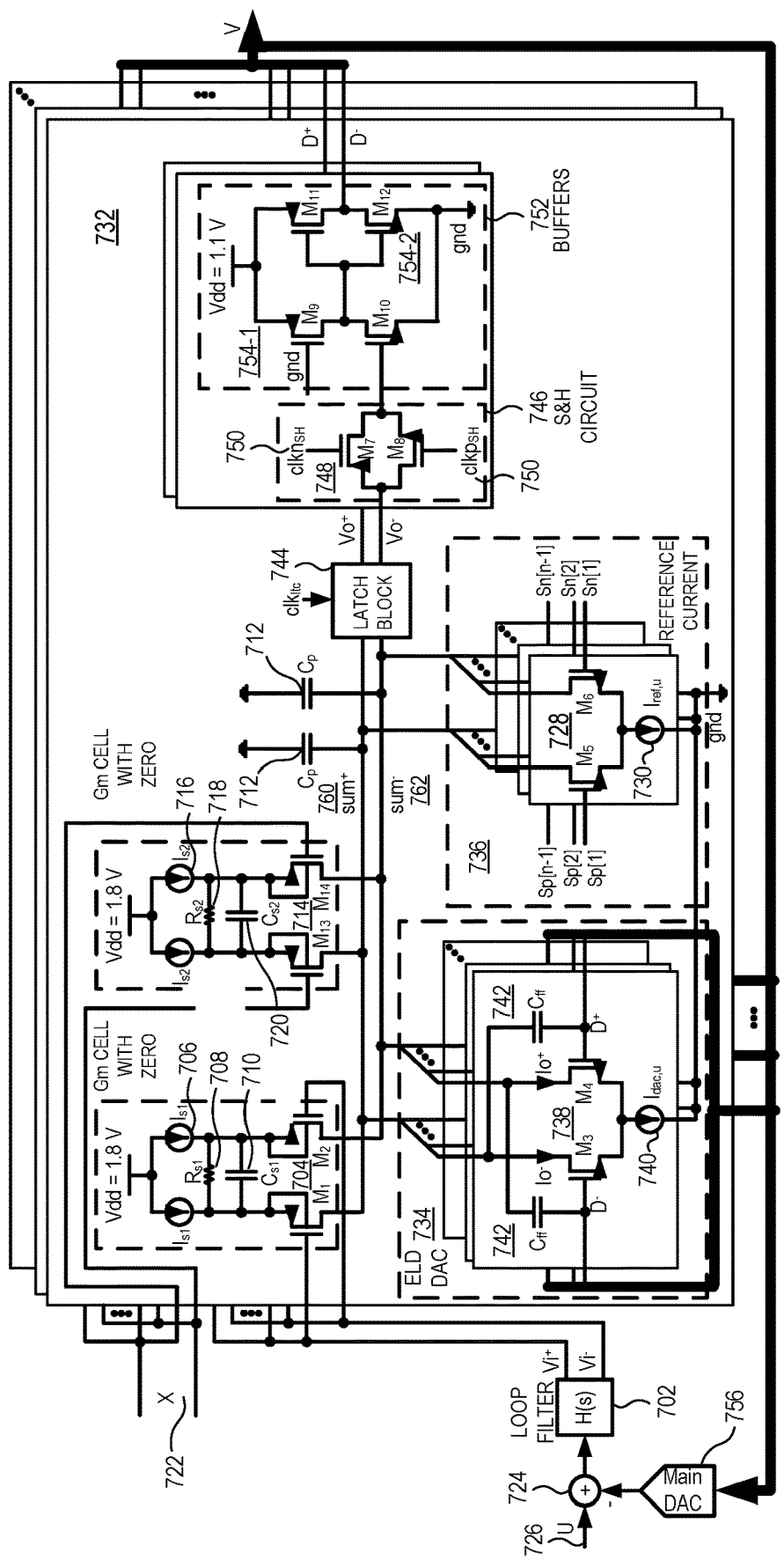
FIG. 7 is a block diagram of a continuous-time sigma-delta ADC in accordance with some embodiments.

FIG. 7 is a block diagram of a transistor-level implementation of a continuous-time sigma-delta ADC 700 in accordance with some embodiments. In the following description of the continuous-time sigma-delta ADC 700, certain components may be added or omitted from the continuous-time sigma-delta ADC 700. The continuous-time sigma-delta ADC 700 may implement aspects of the continuous-time sigma-delta ADC 600 as described in FIG. 6. For example, the continuous-time sigma-delta ADC 700 may implement a multi-bit quantization. The continuous-time sigma-delta ADC 700 may implement a generic summation node and an ELD compensation technique for multi-bit quantization. The continuous-time sigma-delta ADC 700 may thus include multiple slices.

The loop filter 702 may have differential voltage outputs $Vi^+$ and $Vi^-$. These differential voltage signals may be converted to differential current signals with a source-degenerated transconductance (Gm) stage. The source-degenerated Gm stage may be composed of two PMOS transistors 704 (i.e., $M_1$ and $M_2$), two current sources 706 (i.e., $I_{s1}$), source-degeneration resistor 708 (i.e., $R_{s1}$), and a capacitor 710 (i.e., $C_{s1}$). Adding the capacitance 710 (i.e., $C_{s1}$) may provide a zero in the transfer function of the Gm stage and compensate the phase shift caused by the parasitic capacitance 712 (i.e., $C_p$). The current sources 706 (i.e., $I_{s2}$) may be, for example, implemented as a cascaded PMOS current source. The two PMOS transistors 714 (i.e., $M_{13}$ and $M_{14}$), the two current sources 716 (i.e., $I_{s2}$), the source-degeneration resistor 718 (i.e., $R_{s2}$), and the capacitor 720 (i.e., $C_{s2}$) may compose another Gm stage with zero. An input signal 722 (e.g., a signal x) may be converted into a current signal and added in the summing node 760, 762. This input signal 722 may be the input signal 726 (e.g., signal u) of the continuous-time sigma-delta ADC 700, or an internal signal in the loop filter 702.

The NMOS transistors 728 (i.e., NMOS transistors $M_5$-$M_6$) and current sources 730 (i.e., $I_{ref,u}$) compose the reference current 736. The reference current 736 may be designed to have the same common-mode current for every slice 732. The differential reference current signal may be different for every slice 732. The ELD DAC in the slice 732 is an (n+1)-level current steering DAC, which is composed by NMOS transistors 738 (i.e., $M_3$-$M_4$) and the current sources 740 (i.e., $I_{dac,u}$). The ELD DACs 734 may be implemented similarly as the reference current 736, but their switches may be controlled by the digital output of the (n+1)-level comparator.

The current sources in the reference current 736 and ELD DACs 734 can be for example implemented as cascaded NMOS current sources. In every 1-bit current steering DAC, two feed-forward capacitors 742 (i.e., $C_{ff}$) are added. One capacitor 742 (i.e., $C_{ff}$) may be added between $D^-$ and $Io^+$, while another capacitor 742 (i.e., $C_{ff}$) may be added between $D^+$ and $Io^-$.

In the example of FIG. 3, the $Io^-$ node is connected to $sum^+$ node, while the $Io^+$ node is connected to $sum^-$ node. The $sum^+$ and $sum^-$ nodes are the summation nodes for the Gm output current, the ELD DAC output current 734 and the reference current 736. That is, these outputs are at the same time the input of the latch block 744. The latch block 744 output may be sampled by the sample & hold (S&H) circuit 746 (including path gate 748 (i.e., $M_7$-$M_8$)) with the sampling clocks 750 (i.e., $clk_{SH}$). After that, the sampled quantizer output goes through two buffers 752 composed by the transistors 754-1 and 754-2 (i.e., $M_9$-$M_{12}$). The first buffer may be composed by transistors 754-1 (i.e., $M_9$-$M_{10}$) thereby is an NMOS buffer with a PMOS load. The second buffer may be composed by transistors 754-2 (i.e., $M_{11}$-$M_{12}$) and thereby is a CMOS buffer (e.g., a CMOS inverter). The second buffer output $D^+$, $D^-$ may be the digital output V of the continuous-time sigma-delta ADC 700, and they also drive the main DAC 756 and ELD DACs 734.

As illustrated in FIG. 7, among these n slices 732 of duplicated summation node and 1-bit comparator, only the control bits for reference current Sp[1], . . . , Sp[n-1] and Sn[1], . . . , Sn[n-1] are different. While the Gm cell with zero, the ELD DAC with feedforward capacitors, the latch block, the S&H circuit, and buffers are the same for these n slices.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc , magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Although a feedforward SDM architecture is shown as an example in FIGS. 1-7, the present disclosure can also be used in other SDM architectures, such as feedback architectures, and hybrid feedforward-feedback architectures. Although a single-loop SDM architecture is shown as an example in FIGS. 1-7, the present disclosure can also be used in other SDM architectures, such as Multi-stAge noise SHaping (MASH) architectures. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An apparatus for sigma-delta modulation comprising:
a feedback path including a current digital-to-analog converter;
a first capacitor coupled in parallel with the current digital-to-analog converter;
a first transconductance cell coupled to the current digital-to-analog converter, wherein a first output and a second output of the first transconductance cell is coupled to a first output and a second output of the current digital-to-analog converter;
a second transconductance cell coupled to the first transconductance cell, wherein a first output and a second output of the second transconductance cell is coupled to the first output and the second output of the first transconductance cell; and
a second current digital-to-analog converter coupled to the first transconductance cell, wherein a first output and a second output of the second current digital-to-analog converter are coupled to the first output and the second output respectively of the first transconductance cell and an input of the second current digital-to-analog converter is configured to receive a reference code corresponding to a reference current.

2. The apparatus of claim 1, wherein the current digital-to-analog converter comprises a current steering excess loop delay digital-to-analog converter.

3. The apparatus of claim 1, further comprising:
a second capacitor coupled in parallel with the current digital-to-analog converter, wherein the first capacitor is a first feedforward capacitor and the second capacitor is a second feedforward capacitor, both coupled in parallel with the current digital-to-analog converter.

4. The apparatus of claim 3, wherein an input and an output of the first feedforward capacitor is coupled to a first input and a first output of the current digital-to-analog converter.

5. The apparatus of claim 4, wherein an input and an output of the second feedforward capacitor is coupled to a second input and a second output of the current digital-to-analog converter.

6. The apparatus of claim 1, further comprising:
a latch coupled to the current digital-to-analog converter, the first transconductance cell, the second transconductance cell, or a digital-to-analog converter, or a combination thereof.

7. The apparatus of claim 1, wherein the second transconductance cell is configured to compensate a phase shift associated with one or more parasitic capacitances of a sigma-delta modulator associated with the apparatus.

8. The apparatus of claim 1, further comprising:
a loop filter coupled to the first transconductance cell.

9. The apparatus of claim 1, wherein a transfer function of the first transconductance cell comprises a zero for compensating a phase shift.

10. The apparatus of claim 1, wherein a capacitance value of the first capacitor is based on a parasitic capacitance associated with the current digital-to-analog converter.

11. A sigma-delta analog-to-digital converter, comprising:
a plurality of excess loop delays digital-to-analog converter compensation loops, each excess loop delay digital-to-analog converter compensation loop comprising:
a current digital-to-analog converter;
a first transconductance cell coupled to the current digital-to-analog converter;
a second transconductance cell coupled to the first transconductance cell; and
at least two capacitors coupled in parallel with the current digital-to-analog converter; and
a second current digital-to-analog converter coupled to the first transconductance cell, wherein a first output and a second output of the second current digital-to-analog converter are coupled to a first output and a second output respectively of the first transconductance cell and an input of the second current digital-to-analog converter is configured to receive a reference code corresponding to a reference current.

12. The sigma-delta analog-to-digital converter of claim 11, wherein a capacitance value of each capacitor of the at least two capacitors is based on a parasitic capacitance associated with the sigma-delta analog-to-digital converter.

13. The sigma-delta analog-to-digital converter of claim 11, wherein each excess loop delay digital-to-analog converter compensation loop comprises a one-bit comparator coupled to a latch of the sigma-delta analog-to-digital converter.

14. The sigma-delta analog-to-digital converter of claim 11, further comprising a multibit comparator coupled to a latch of the sigma-delta analog-to-digital converter.

15. The sigma-delta analog-to-digital converter of claim 11, wherein the at least two capacitors are feedforward capacitors coupled in parallel with the current digital-to-analog converter.

16. A method for sigma-delta modulation at a device, comprising:
receiving a signal via a current digital-to-analog converter of the device;
generating excess loop delay feedback information based on compensating parasitic capacitance associated with a sigma-delta analog-to-digital converter of the device using a set of capacitors coupled in parallel with the current digital-to-analog converter of the device, a first transconductance cell coupled to the current digital-to-analog converter, a second transconductance cell coupled to the first transconductance cell, and a second current digital-to-analog converter coupled to the first transconductance cell, wherein a first output and a second output of the second current digital-to-analog converter are coupled to a first output and a second output respectively of the first transconductance cell and an input of the second current digital-to-analog converter is configured to receive a reference code corresponding to a reference current; and outputting the generated excess loop delay feedback information.

17. A sigma-delta analog-to-digital converter, comprising:
a plurality of excess loop delays digital-to-analog converter compensation loops, each excess loop delay digital-to-analog converter compensation loop comprising:
a current digital-to-analog converter;
at least two capacitors coupled in parallel with the current digital-to-analog converter; and
a one-bit comparator coupled to a latch of the sigma-delta analog-to-digital converter; and
a second current digital-to-analog converter coupled to a first current digital-to-analog converter of the plurality of excess loop delays digital-to-analog converter compensation loops, wherein a first output and a second output of the second current digital-to-analog converter are coupled to a first output and a second output respectively of the first current digital-to-analog converter and an input of the second current digital-to-analog converter is configured to receive a reference code corresponding to a reference current.

18. The sigma-delta analog-to-digital converter of claim 17, wherein a capacitance value of each capacitor of the at least two capacitors is based on a parasitic capacitance associated with the sigma-delta analog-to-digital converter.

19. The sigma-delta analog-to-digital converter of claim 17, wherein the at least two capacitors are feedforward capacitors coupled in parallel with the current digital-to-analog converter.

* * * * *